United States Patent
Honda et al.

(10) Patent No.: US 11,677,363 B2
(45) Date of Patent: Jun. 13, 2023

(54) POWER AMPLIFIER CIRCUIT

(71) Applicant: Murata Manufacturing Co., Ltd., Kyoto (JP)

(72) Inventors: Yuri Honda, Kyoto (JP); Fumio Harima, Kyoto (JP); Mitsuhiro Toya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 228 days.

(21) Appl. No.: 16/883,128

(22) Filed: May 26, 2020

(65) Prior Publication Data

US 2020/0382082 A1    Dec. 3, 2020

(30) Foreign Application Priority Data

May 27, 2019   (JP) .............................. JP2019-098682

(51) Int. Cl.
*H03F 1/30* (2006.01)
*H03F 3/21* (2006.01)
*H03F 1/02* (2006.01)

(52) U.S. Cl.
CPC .............. *H03F 3/21* (2013.01); *H03F 1/0216* (2013.01); *H03F 2200/451* (2013.01)

(58) Field of Classification Search
CPC ................ H03F 1/30; H03F 3/20; H03G 3/30
USPC .................................................. 330/285, 296
See application file for complete search history.

(56) References Cited

U.S. PATENT DOCUMENTS

| 10,291,187 B2* | 5/2019 | Honda ...................... H03F 3/21 |
| 2003/0011434 A1* | 1/2003 | Luo ......................... H03F 3/191 330/281 |
| 2019/0149095 A1* | 5/2019 | Satou ...................... H03F 3/213 330/296 |
| 2021/0194439 A1* | 6/2021 | Honda ...................... H03F 3/21 |
| 2021/0194442 A1* | 6/2021 | Han ....................... H03F 1/0233 |

FOREIGN PATENT DOCUMENTS

JP          2017-112588 A      6/2017

* cited by examiner

*Primary Examiner* — Henry Choe
(74) *Attorney, Agent, or Firm* — Pearne & Gordon LLP

(57) ABSTRACT

A power amplifier circuit includes a first transistor configured to receive a first signal at a base, amplify the first signal, and output a second signal from a collector; and a bias circuit configured to supply a bias current to the base of the first transistor. The bias circuit includes a second transistor configured to supply a bias current to the base of the first transistor, a third transistor including a base connected to a base of the second transistor and a collector connected to a collector of the second transistor, and a fourth transistor including a base connected to an emitter of the third transistor and a collector connected to an emitter of the second transistor and configured to draw at least part of the bias current.

19 Claims, 8 Drawing Sheets

POWER AMPLIFIER CIRCUIT

This application claims priority from Japanese Patent Application No. 2019-098682 filed on May 27, 2019. The content of this application is incorporated herein by reference in its entirety.

BACKGROUND OF THE DISCLOSURE

1. Field of the Disclosure

The present disclosure relates to a power amplifier circuit.

2. Description of the Related Art

In mobile communication devices, such as cellular phones, a power amplifier circuit is used to amplify power of a radio frequency (RF) signal to be transmitted to a base station. In the power amplifier circuit, a bipolar transistor, such as a heterojunction bipolar transistor (HBT), is used as an amplifier element.

When a bipolar transistor is driven with a fixed base-emitter voltage, a collector current increases along with a rise in temperature. When an increase in collector current leads to an increase in power consumption, positive feedback (thermal runaway) can occur in which an element temperature rises to thereby cause the collector current to further increase. For this reason, when a bipolar transistor is used in a power amplifier circuit, suppression of thermal runaway of the bipolar transistor is desired. For example, Japanese Unexamined Patent Application Publication No. 2017-112588 discloses a power amplifier circuit including a power amplifier that includes a bipolar transistor, and a bias circuit that supplies a bias current to a base of the bipolar transistor. The bias circuit includes an emitter follower transistor that supplies a bias current to the base of the bipolar transistor, and a bias voltage supply circuit that supplies a bias voltage to a base of the emitter follower transistor and is constituted by a diode. Thermal coupling is provided between the diode included in the bias voltage supply circuit and the bipolar transistor. This improves the uniformity of temperature distribution in the bipolar transistor.

In a waveform of time response of output power of the power amplifier (bipolar transistor), the power amplifier (bipolar transistor) generates heat along with a rise in the level of a current inputted to the base of the emitter follower transistor, which is a portion of the bias circuit, and the temperature thereof starts to rise. As described above, since the diode included in the bias circuit is thermally coupled to the power amplifier (bipolar transistor), the temperature of the diode similarly rises. At this time, a current that flows to the diode also increases slightly along with a rise in temperature. Thus, a base current of the emitter follower transistor decreases with time, and a base current of the bipolar transistor also decreases slightly with time.

Here, if the current amplification factor of the bipolar transistor is fixed, a collector current also decreases slightly with time. However, the current amplification factor of the bipolar transistor deteriorates due to a change in temperature. For this reason, the collector current decreases steeply in comparison with the base current. The gain of the power amplifier is proportional to the collector current. Thus, power of an output signal obtained from an output terminal of the power amplifier also decreases steeply with time.

BRIEF SUMMARY OF THE DISCLOSURE

The present disclosure has been made in consideration of such circumstances and provides a power amplifier in which time response of an output signal is suppressed.

A power amplifier circuit according to an aspect of the present disclosure includes a first transistor configured to receive a first signal at a base, amplify the first signal, and output a second signal from a collector; and a bias circuit configured to supply a bias current to the base of the first transistor. The bias circuit includes a second transistor configured to supply a bias current to the base of the first transistor, a third transistor including a base connected to a base of the second transistor and a collector connected to a collector of the second transistor, and a fourth transistor including a base connected to an emitter of the third transistor and a collector connected to an emitter of the second transistor and configured to draw at least part of the bias current.

The present disclosure enables time response of an output signal of the power amplifier to be suppressed.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
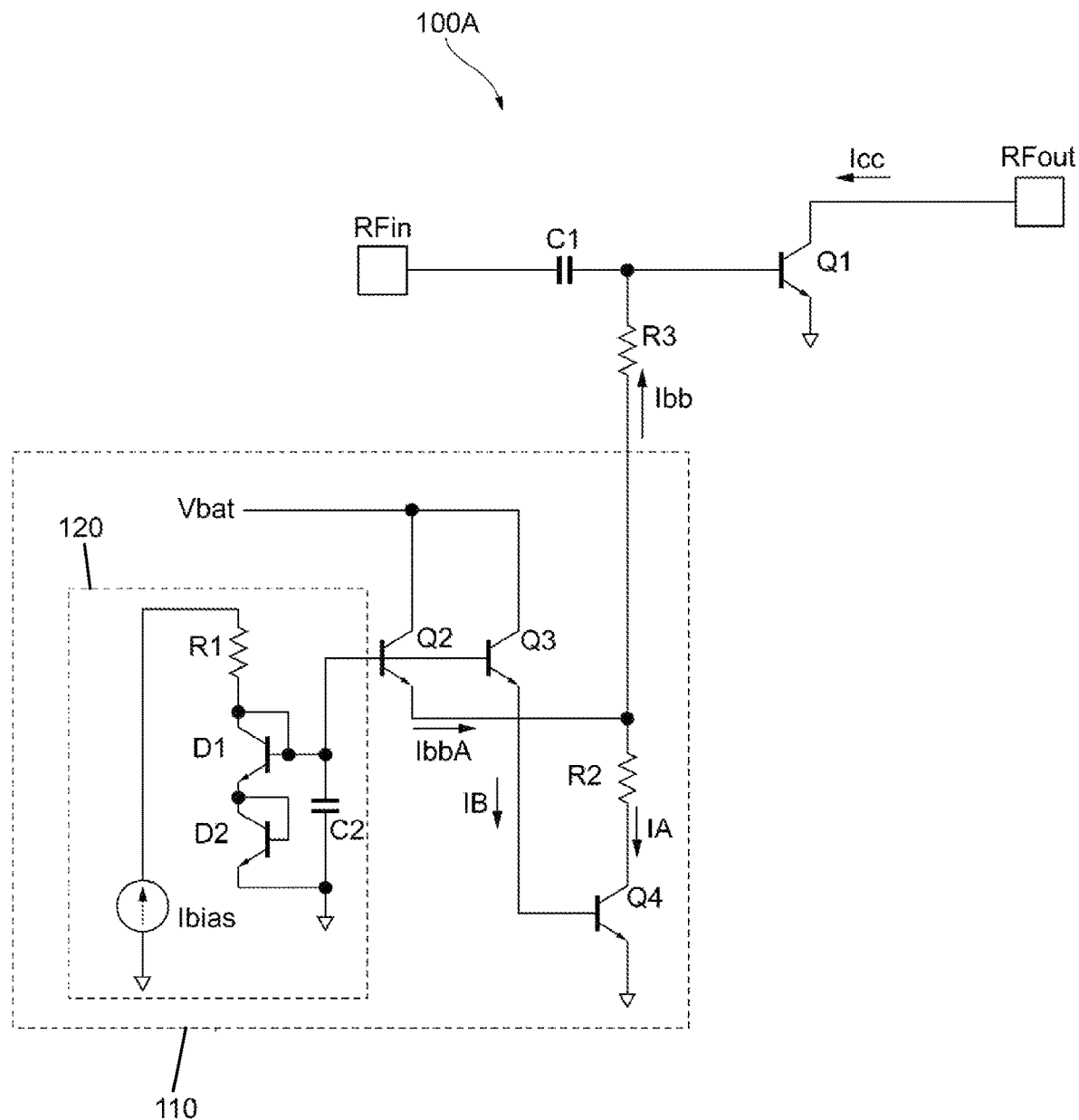
FIG. 1 illustrates a configuration of a power amplifier circuit according to a first embodiment of the present disclosure.

Embodiments of the present disclosure will be described below with reference to the drawings. Incidentally, in figures, elements denoted by the same reference numerals have the same or a similar configuration.

First Embodiment (1) Configuration

FIG. 1 illustrates a configuration of a power amplifier circuit 100A according to a first embodiment of the present disclosure. For example, in a mobile communication device, such as a cellular phone, the power amplifier circuit 100A is an integrated circuit for amplifying power of an RF signal to be transmitted to a base station. As illustrated in FIG. 1, the power amplifier circuit 100A includes a bipolar transistor Q1 (first transistor), a bias circuit 110, a resistor R3, and a capacitor C1.

In the bipolar transistor Q1 (first transistor), a power supply voltage Vcc is supplied to a collector through an inductor, which is not illustrated, an RF signal RFin (first signal) is supplied to a base through the capacitor C1, and an emitter is grounded. Furthermore, a bias voltage or bias current is supplied to the base of the bipolar transistor Q1 through the resistor R3. Thus, an amplified signal RFout (second signal) is outputted from the collector of the bipolar transistor Q1.

The bias circuit 110 is a circuit for supplying a bias current to the bipolar transistor Q1. The bias circuit 110 includes bipolar transistors Q2 (second transistor), Q3 (third transistor), and Q4 (fourth transistor), a voltage supply circuit 120, and a resistor R2.

In the bipolar transistor Q2 (second transistor), a battery voltage Vbat is supplied to a collector, and a voltage is supplied to a base from the voltage supply circuit 120. Furthermore, the bipolar transistor Q2 supplies a bias current Ibb from an emitter to the base of the bipolar transistor Q1 through the resistor R3 and supplies a current IA from the emitter to a collector of the bipolar transistor Q4.

The voltage supply circuit 120 controls a base voltage of the bipolar transistor Q2 in accordance with a control current Ibias (a current inputted to a control terminal). Specifically, the voltage supply circuit 120 includes a diode D1 and a diode D2. The diodes D1 and D2 are connected in series, an anode of the diode D1 is connected to the base of the bipolar transistor Q2, and a cathode of the diode D2 is grounded. A capacitor C2 is connected in parallel with the diodes D1 and D2. Furthermore, the control current Ibias is supplied to the anode of the diode D1 through a resistor R1. Thus, a voltage (first voltage) corresponding to a forward voltage of the diodes D1 and D2 is generated at the anode of the diode D1, and this voltage is supplied to the base of the bipolar transistor Q2. Due to the characteristics of the forward voltage of the diodes D1 and D2, the voltage generated at the anode of the diode D1 decreases along with a rise in temperature. The capacitor C2 is provided to stabilize a voltage to be supplied by the voltage supply circuit 120. As illustrated in FIG. 1, each of the diodes D1 and D2 can be implemented with a configuration in which a base and a collector of a bipolar transistor are connected to each other. This circuit configuration is commonly referred to as "diode-connected".

The bipolar transistor Q3 (third transistor) is an element that performs operation similar to that of the bipolar transistor Q2. In the bipolar transistor Q3, as in the bipolar transistor Q2, the battery voltage Vbat is supplied to a collector, and the voltage (first voltage) is supplied to a base from the voltage supply circuit 120. Furthermore, the bipolar transistor Q3 supplies a current IB from an emitter to a base of the bipolar transistor Q4.

The bipolar transistor Q4 (fourth transistor) is an element for drawing part of a current that flows from the emitter of the bipolar transistor Q2 to the base of the bipolar transistor Q1. In the bipolar transistor Q4, the current IA is supplied to the collector from the bipolar transistor Q2 through the resistor R2, the current IB is supplied to the base from the bipolar transistor Q3, and an emitter is grounded. In other words, part of a current that flows from the emitter of the bipolar transistor Q2 serves as the bias current Ibb that flows to the base of the bipolar transistor Q1 through the resistor R3, and the other part serves as the current IA that flows to the collector of the bipolar transistor Q4 through the resistor R2. Incidentally, the resistor R2 keeps the bias current Ibb of the bipolar transistor Q1 from being used up. The power amplifier circuit 100A does not have to include the resistor R2.

(2) Layout

Figure 2A:
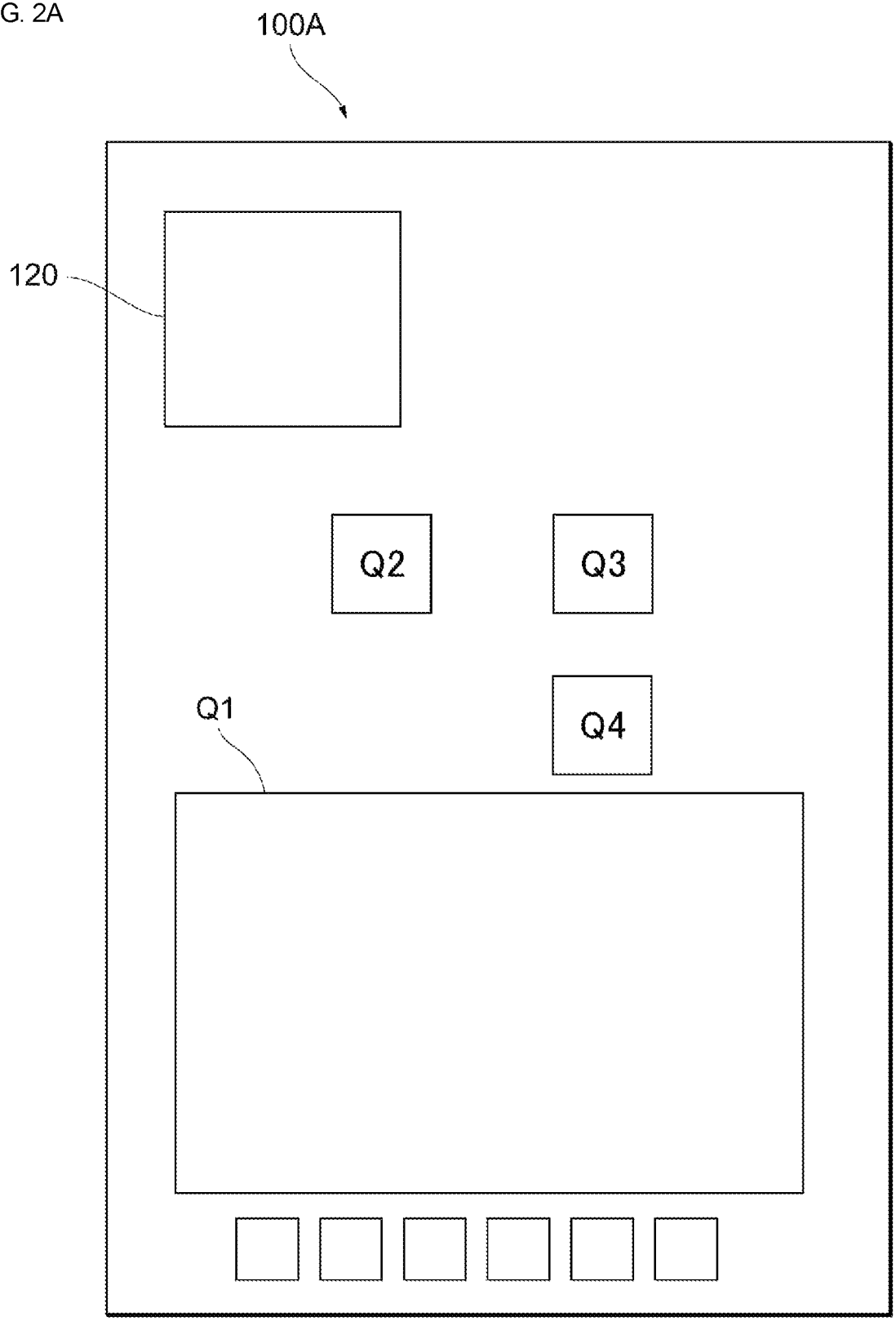
FIG. 2A illustrates an example of a layout of the power amplifier circuit.
Figure 2B:
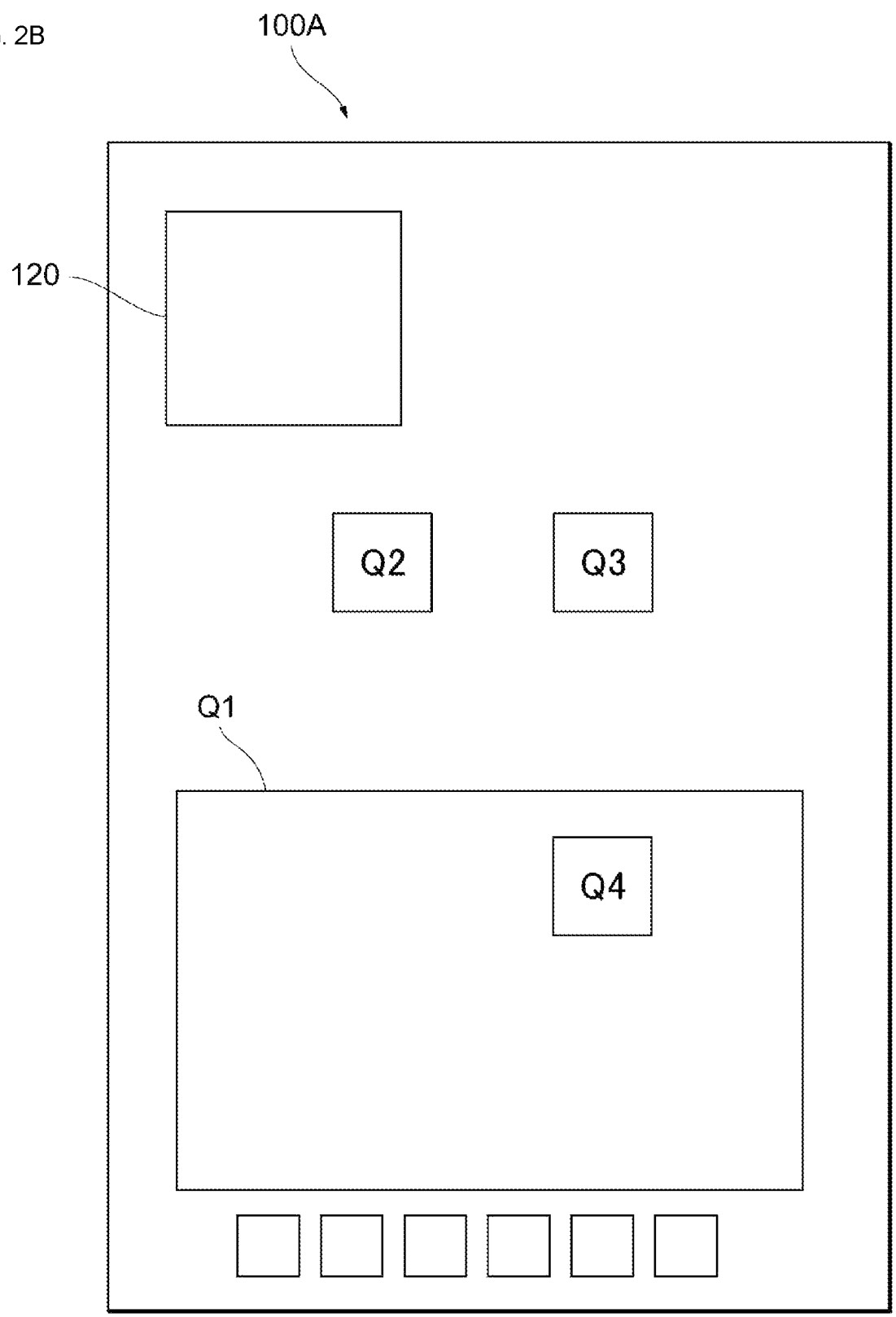
FIG. 2B illustrates another example of the layout of the power amplifier circuit.

FIGS. 2A and 2B each illustrate an example of a layout of the power amplifier circuit 100A. Layouts illustrated in FIGS. 2A and 2B are schematic and do not each represent the configuration of all elements of the power amplifier circuit 100A.

In the power amplifier circuit 100A, the bipolar transistor Q4 is thermally coupled to the bipolar transistor Q1. Here, thermal coupling between the bipolar transistor Q4 and the bipolar transistor Q1 refers to, for example, the case where the bipolar transistor Q4 and the bipolar transistor Q1 are thermally coupled to each other to such an extent that a variation in the current amplification factor of the bipolar transistor Q4 with respect to heat is substantially the same as a variation in the current amplification factor of the bipolar transistor Q1 with respect to heat. Specifically, for example, as illustrated in FIG. 2A, the bipolar transistor Q4 may be disposed adjacent to a substantially rectangular region in which the bipolar transistor Q1 is formed. Alternatively, for example, as illustrated in FIG. 2B, the bipolar transistor Q4 may be disposed within the substantially rectangular region in which the bipolar transistor Q1 is formed. Furthermore, examples of thermal coupling between the bipolar transistor Q4 and the bipolar transistor Q1 include the case where, even when a line or the like is provided between the bipolar transistor Q1 and the bipolar transistor Q4, the bipolar transistor Q4 and the bipolar transistor Q1 are the same (including substantially the same) in a variation in current amplification factor with respect to heat.

(3) Operation and Effect (3-1) Effect of Bipolar Transistors Q3 and Q4

Figure 3A:
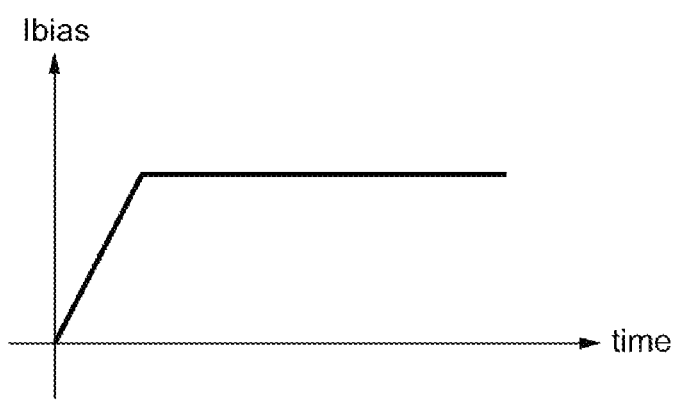
FIG. 3A illustrates operation of the power amplifier circuit.

FIGS. 3A to 3E each illustrate operation of the power amplifier circuit 100A. First, the effect of the bipolar transistors Q3 and Q4 will be described. The control current Ibias inputted to the control terminal rises in level, and the bipolar transistor Q1 starts to amplify the RF signal RFin (FIG. 3A). The rise in the level of the control current Ibias causes a current that flows to the diodes D1 and D2 (whose temperatures follow a rise in the temperature of the bipolar transistor Q1 after a certain time delay) to increase gradually, and a voltage and a current supplied to the base of the bipolar transistor Q2 also increase gradually. Thus, a current IbbA (bias current Ibb+current IA) that flows from the emitter of the bipolar transistor Q2 also increases gradually.

Figure 3B:
FIG. 3B illustrates operation of the power amplifier circuit.
Figure 3C:
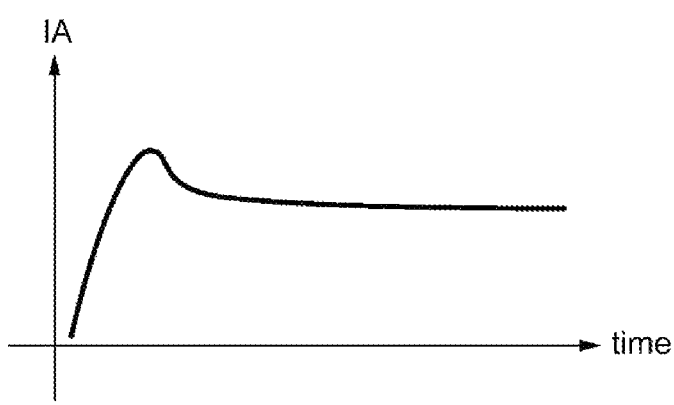
FIG. 3C illustrates operation of the power amplifier circuit.

Here, the bipolar transistor Q3 performs operation similar to that of the bipolar transistor Q2. Specifically, when a gradual increase in the current that flows to the diodes D1 and D2 causes a base voltage of the bipolar transistor Q3 to increase gradually, the current IB that flows from the emitter of the bipolar transistor Q3 also increases gradually (FIG. 3B). Subsequently, the current IB that flows from the emitter of the bipolar transistor Q3 is supplied to the base of the bipolar transistor Q4. Hence, when the current IB increases gradually, the current IA that flows to the collector of the bipolar transistor Q4 increases gradually. Thus, part of the current IbbA that flows from the emitter of the bipolar transistor Q2 is drawn as the current IA that flows to the collector of the bipolar transistor Q4, thereby causing the bias current Ibb (current IbbA-current IA) of the bipolar transistor Q1 to increase slightly.

Since the bias current Ibb increases slightly, a collector current Icc that flows to the collector of the bipolar transistor Q1 also increases slightly, and time response of the output signal RFout of the bipolar transistor Q1 is suppressed. As a result, it can be said that, when the bipolar transistors Q3 and Q4 draw at least part of a current that flows from the emitter of the bipolar transistor Q2 to the base of the bipolar transistor Q1, time response of an output signal is suppressed in the power amplifier circuit 100A.

(3-2) Improvement in Effect of Bipolar Transistor Q4 Due to Thermal Coupling

Next, an improvement in the above-described effect of suppressing time response of an output signal due to thermal coupling between the bipolar transistor Q4 and the bipolar transistor Q1 will be described. As described above, the bipolar transistor Q4 is thermally coupled to the bipolar transistor Q1, and the temperature of the bipolar transistor Q4 therefore rises along with a rise in the temperature of the bipolar transistor Q1. Thus, in common with the current amplification factor of the bipolar transistor Q1, the current amplification factor of the bipolar transistor Q4 deteriorates. Due to the deterioration of the current amplification factor of the bipolar transistor Q4, the current IA that flows to the collector of the bipolar transistor Q4 decreases sharply (FIG. 3C), and the bias current Ibb that flows from the emitter of the bipolar transistor Q2 to the base of the bipolar transistor Q1 therefore increases.

Figure 3D:
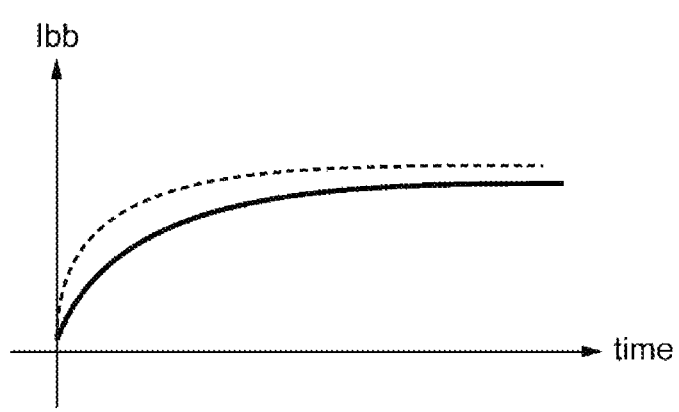
FIG. 3D illustrates operation of the power amplifier circuit.

Here, a solid line in FIG. 3D represents the bias current Ibb of the bipolar transistor Q1 in the power amplifier circuit 100A, and a dashed line in FIG. 3D represents a bias current of the bipolar transistor Q1 in a power amplifier circuit in a comparative example. The power amplifier circuit in the comparative example does not include the bipolar transistors Q3 and Q4. For this reason, in the power amplifier circuit in the comparative example, a bias current supplied from the emitter of the bipolar transistor Q2 to the base of the bipolar transistor Q1 is not drawn by another bipolar transistor Q4 or the like. Hence, as illustrated in FIG. 3D, the bias current Ibb of the bipolar transistor Q1 in the power amplifier circuit 100A increases more slowly than the bias current of the bipolar transistor Q1 in the power amplifier circuit in the comparative example.

Figure 3E:
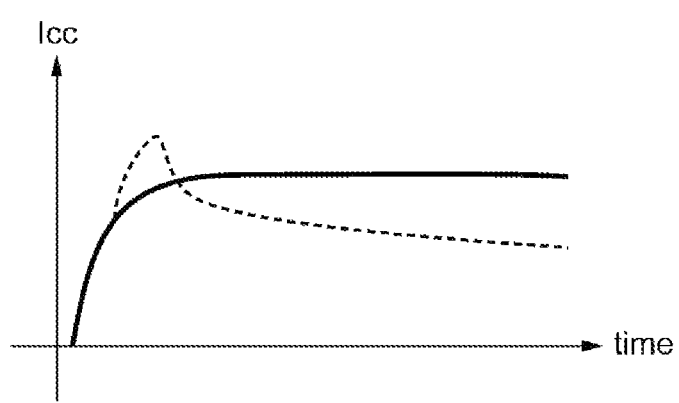
FIG. 3E illustrates operation of the power amplifier circuit.

A solid line in FIG. 3E represents the collector current Icc of the bipolar transistor Q1 in the power amplifier circuit 100A, and a dashed line in FIG. 3E represents a collector current of the bipolar transistor Q1 in the power amplifier circuit in the comparative example. Thus, in the power amplifier circuit 100A, the bias current Ibb increases relatively slowly (FIG. 3D), and the extent that the collector current Icc of the bipolar transistor Q1 is affected by the deterioration of the current amplification factor due to heat therefore decreases. For this reason, as illustrated in FIG. 3E, in the power amplifier circuit 100A, the collector current Icc converges to a fixed current faster than that in the power amplifier circuit in the comparative example. As a result, thermal coupling between the bipolar transistor Q4 and the bipolar transistor Q1 improves the above-described effect of suppressing time response of an output signal.

Second Embodiment

Figure 4:
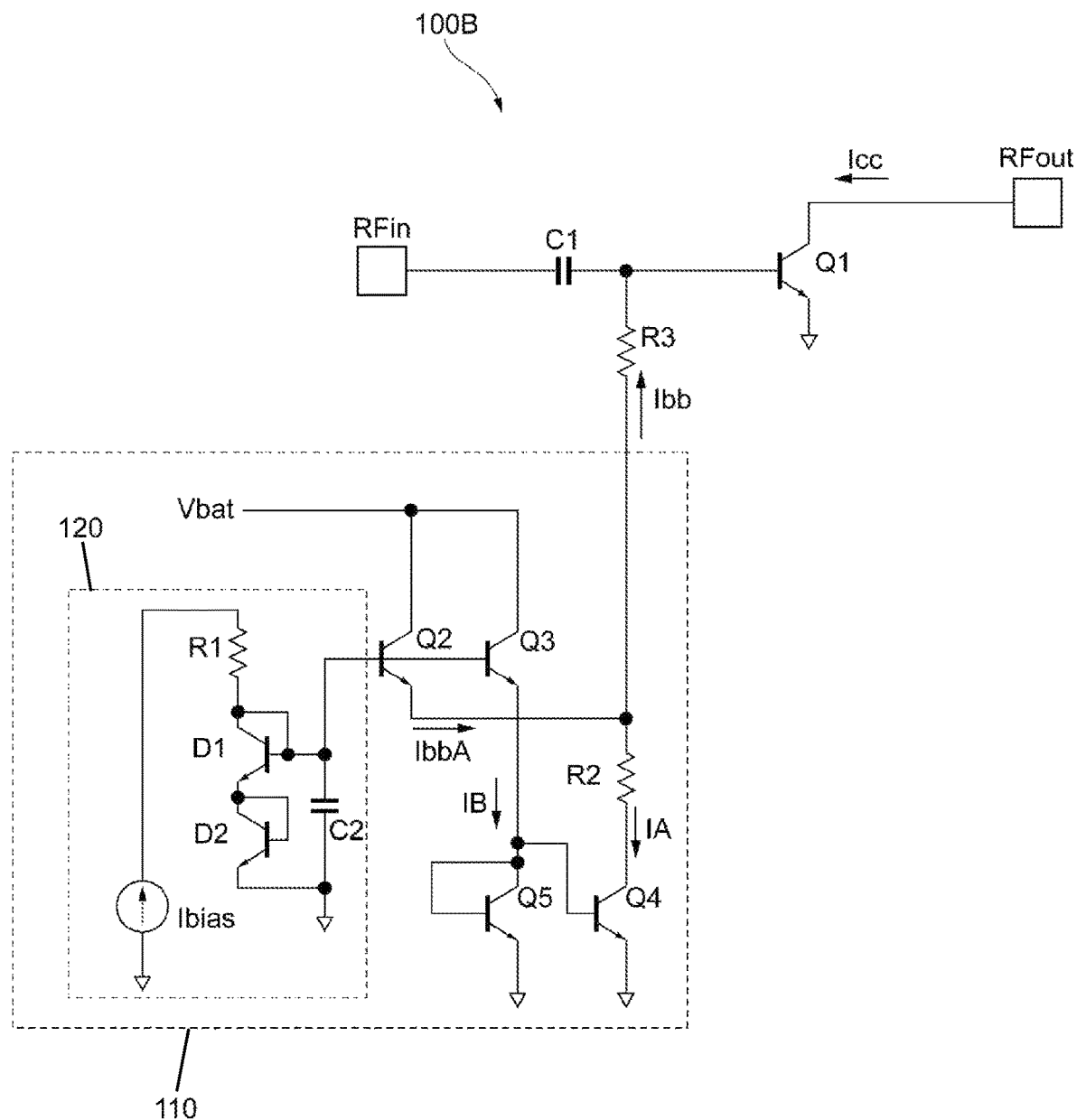
FIG. 4 illustrates a configuration of a power amplifier circuit according to a second embodiment of the present disclosure.

FIG. 4 illustrates a configuration of a power amplifier circuit 100B according to a second embodiment of the present disclosure. As illustrated in FIG. 4, the power amplifier circuit 100B further includes a bipolar transistor Q5 (fifth transistor) in addition to the configuration of the power amplifier circuit 100A.

In the bipolar transistor Q5 (fifth transistor), a base and a collector are connected to a conductive wire connecting the emitter of the bipolar transistor Q3 and the base of the bipolar transistor Q4, and an emitter is grounded. As described above, the bipolar transistor Q3 (third transistor) performs operation similar to that of the bipolar transistor Q2. The bipolar transistor Q5 has the effect of bringing the operation of the bipolar transistor Q3 closer to the operation of the bipolar transistor Q2. Furthermore, when the size of the bipolar transistor Q5 is adjusted, the bias current Ibb of the bipolar transistor Q1 can be controlled.

Figure 5A:
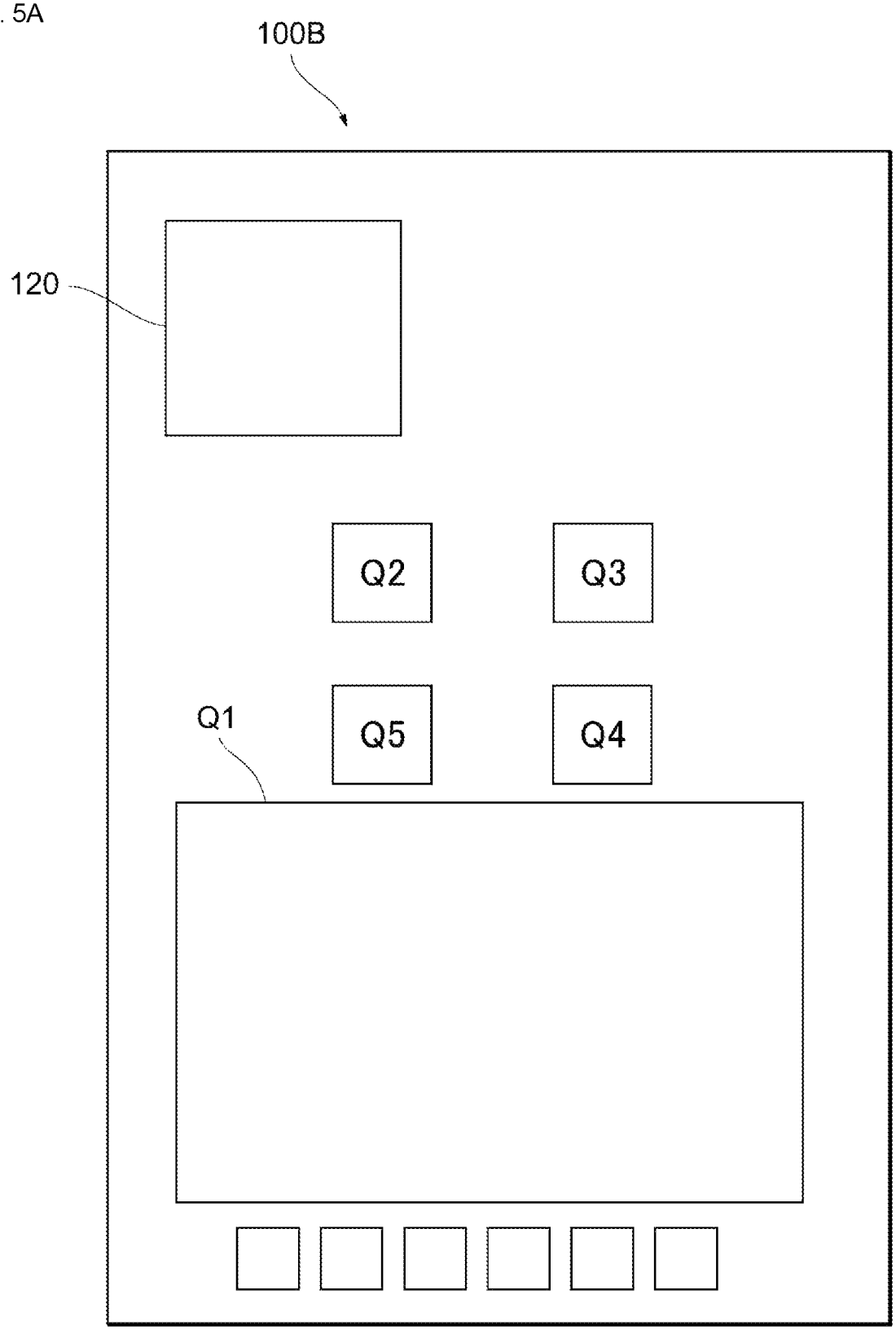
FIG. 5A illustrates an example of a layout of the power amplifier circuit.
Figure 5B:
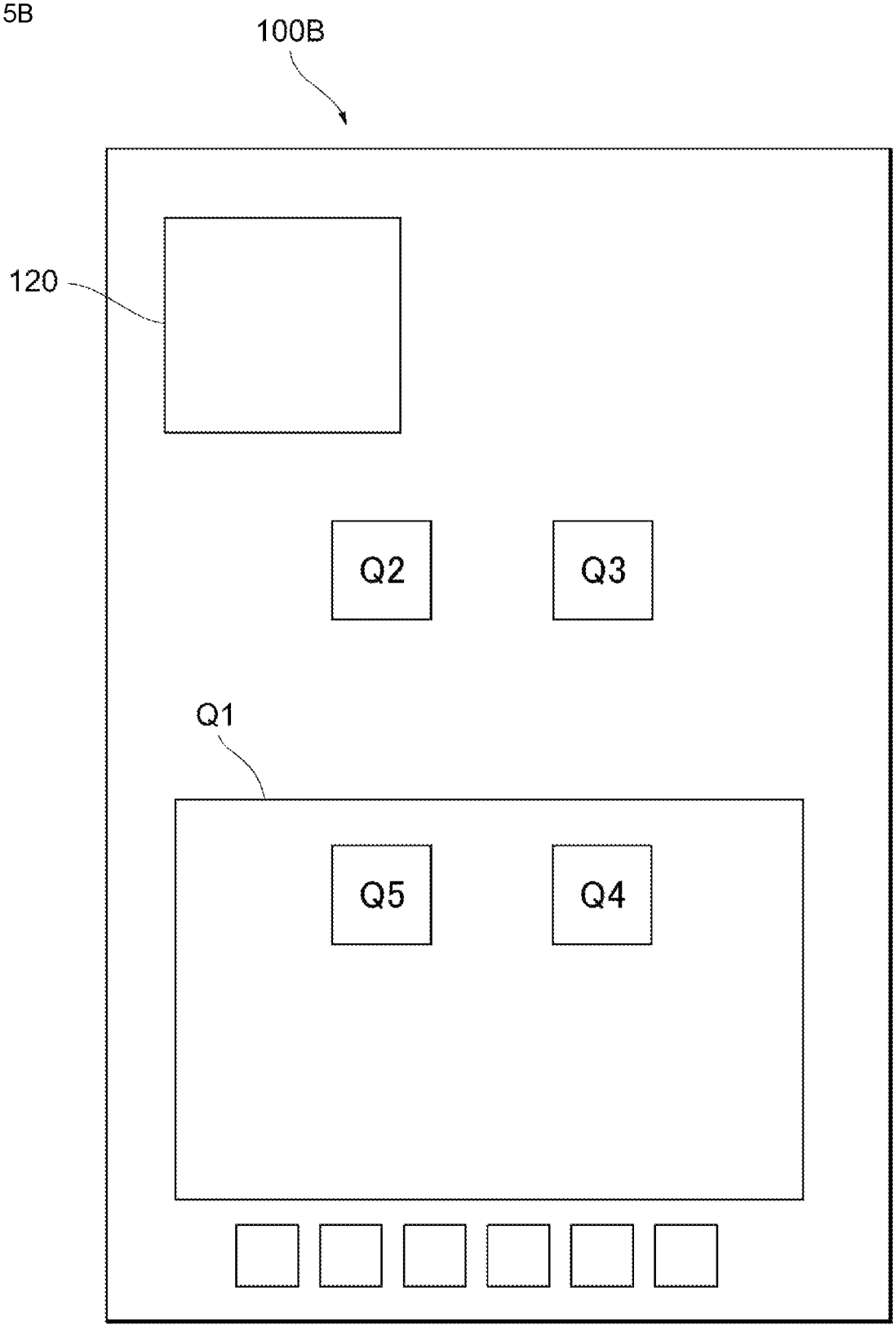
FIG. 5B illustrates another example of the layout of the power amplifier circuit.

FIGS. 5A and 5B each illustrate an example of a layout of the power amplifier circuit 100B. Layouts illustrated in FIGS. 5A and 5B are schematic and do not each represent the configuration of all elements of the power amplifier circuit 100B.

In the power amplifier circuit 100B, the bipolar transistor Q5 is thermally coupled to the bipolar transistor Q1. Specifically, for example, as illustrated in FIG. 5A, the bipolar transistor Q5 may be disposed adjacent to a substantially rectangular region in which the bipolar transistor Q1 is formed. Alternatively, for example, as illustrated in FIG. 5B, the bipolar transistor Q5 may be disposed within the substantially rectangular region in which the bipolar transistor Q1 is formed. Furthermore, examples of thermal coupling between the bipolar transistor Q5 and the bipolar transistor Q1 include the case where, even when a line or the like is provided between the bipolar transistor Q1 and the bipolar transistor Q5, the bipolar transistor Q5 and the bipolar transistor Q1 are the same in a variation in current amplification factor with respect to heat.

The exemplary embodiments of the present disclosure have been described above. A power amplifier circuit according to an embodiment of the present disclosure includes a first transistor configured to amplify a first signal and output a second signal; and a bias circuit configured to supply a bias current to a base of the first transistor. The bias circuit includes a voltage supply circuit, a second transistor configured to supply a bias current to the base of the first transistor, a third transistor including a base connected to a base of the second transistor and a collector connected to a collector of the second transistor, and a fourth transistor including a base connected to an emitter of the third transistor and a collector connected to an emitter of the second transistor and configured to draw at least part of the bias current. Thus, when the third transistor and the fourth transistor draw at least part of a current that flows from the emitter of the second transistor to the base of the first transistor, time response of an output signal (second signal) is suppressed in the power amplifier circuit.

Furthermore, in the above-described power amplifier circuit, the fourth transistor may be thermally coupled to the first transistor. Thus, when the current amplification factor of the first transistor deteriorates due to heat, the current amplification factor of the fourth transistor similarly deteriorates due to heat. For this reason, when the current amplification factor deteriorates due to a rise in temperature, an output signal of the first transistor decreases, but the amount by which the fourth transistor draws the bias current supplied from the second transistor to the first transistor also decreases under the influence of the deterioration of the current amplification factor due to a rise in temperature. Hence, the effect of suppressing time response of the output signal in the power amplifier circuit is improved.

Furthermore, in the above-described power amplifier circuit, the fourth transistor may be disposed adjacent to a substantially rectangular region in which the first transistor is formed. This enables the fourth transistor to be efficiently thermally coupled to the first transistor.

Furthermore, in the above-described power amplifier circuit, the fourth transistor may be disposed within a substantially rectangular region in which the first transistor is formed. This enables the fourth transistor to be efficiently thermally coupled to the first transistor.

Furthermore, in the above-described power amplifier circuit, the bias circuit may further include a fifth transistor including a base and a collector that are connected to the emitter of the third transistor and including an emitter that is grounded. This can bring the operation of the third transistor closer to the operation of the second transistor.

Furthermore, in the above-described power amplifier circuit, the fifth transistor may be thermally coupled to the first transistor. Thus, in common with the current amplification factor of the first transistor, the current amplification factor of the fifth transistor deteriorates due to a change in temperature. For this reason, the operation of the third transistor can be brought closer to the operation of the second transistor.

Furthermore, in the above-described power amplifier circuit, the fifth transistor may be disposed adjacent to a substantially rectangular region in which the first transistor is formed. This enables the fifth transistor to be efficiently thermally coupled to the first transistor.

Furthermore, in the above-described power amplifier circuit, the fifth transistor may be disposed within a substantially rectangular region in which the first transistor is formed. This enables the fifth transistor to be efficiently thermally coupled to the first transistor.

Furthermore, in the above-described power amplifier circuit, the bias circuit may further include a resistor having one end connected to the emitter of the second transistor and another end connected to the collector of the fourth transistor. This can keep the bias current of the first transistor from being used up.

The above-described embodiments are intended to facilitate understanding of the present disclosure but are not intended for a limited interpretation of the present disclosure. The present disclosure can be changed or improved without departing from the gist thereof and encompasses equivalents thereof. That is, appropriate design changes made to the embodiments by those skilled in the art are also encompassed in the scope of the present disclosure as long as the changes have features of the present disclosure. For example, the elements included in the embodiments, and the arrangement, materials, conditions, shapes, sizes, and so forth of the elements are not limited to those exemplified herein and can be appropriately changed. Furthermore, the elements included in the embodiments can be combined as much as technically possible, and such combined elements are also encompassed in the scope of the present disclosure as long as the combined elements have features of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
a first transistor configured to receive a first signal at a base, amplify the first signal, and output a second signal from a collector; and
a bias circuit configured to supply a bias current to the base of the first transistor,
wherein the bias circuit includes
a second transistor configured to supply the bias current to the base of the first transistor,
a third transistor including a base connected to a base of the second transistor and a collector connected to a collector of the second transistor, and
a fourth transistor including a base connected to an emitter of the third transistor and a collector connected to an emitter of the second transistor and configured to draw at least part of the bias current, wherein the fourth transistor is disposed adjacent to a rectangular region in which the first transistor is formed.

2. A power amplifier circuit comprising:
a first transistor configured to receive a first signal at a base, amplify the first signal, and output a second signal from a collector; and
a bias circuit configured to supply a bias current to the base of the first transistor,
wherein the bias circuit includes
a second transistor configured to supply the bias current to the base of the first transistor,
a third transistor including a base connected to a base of the second transistor and a collector connected to a collector of the second transistor, and
a fourth transistor including a base connected to an emitter of the third transistor and a collector connected to an emitter of the second transistor and configured to draw at least part of the bias current,
wherein the fourth transistor is thermally coupled to the first transistor.

3. The power amplifier circuit according to claim 2, wherein the fourth transistor is disposed within a rectangular region in which the first transistor is arranged.

4. The power amplifier circuit according to claim 2, wherein the bias circuit further includes a fifth transistor including a base and a collector that are connected to the emitter of the third transistor and including an emitter that is grounded.

5. The power amplifier circuit according to claim 1, wherein the bias circuit further includes a fifth transistor including a base and a collector that are connected to the emitter of the third transistor and including an emitter that is grounded.

6. The power amplifier circuit according to claim 3, wherein the bias circuit further includes a fifth transistor including a base and a collector that are connected to the emitter of the third transistor and including an emitter that is grounded.

7. The power amplifier circuit according to claim 4, wherein the fifth transistor is thermally coupled to the first transistor.

8. The power amplifier circuit according to claim 5, wherein the fifth transistor is thermally coupled to the first transistor.

9. The power amplifier circuit according to claim 6, wherein the fifth transistor is thermally coupled to the first transistor.

10. The power amplifier circuit according to claim 7, wherein the fifth transistor is disposed adjacent to a rectangular region in which the first transistor is arranged.

11. The power amplifier circuit according to claim 7, wherein the fifth transistor is disposed within a rectangular region in which the first transistor is arranged.

12. The power amplifier circuit according to claim 1, wherein the bias circuit further includes a resistor having one end connected to the emitter of the second transistor and another end connected to the collector of the fourth transistor.

13. The power amplifier circuit according to claim 2, wherein the bias circuit further includes a resistor having one end connected to the emitter of the second transistor and another end connected to the collector of the fourth transistor.

14. The power amplifier circuit according to claim 1, wherein the bias circuit further includes a resistor having one end connected to the emitter of the second transistor and another end connected to the collector of the fourth transistor.

15. The power amplifier circuit according to claim 3, wherein the bias circuit further includes a resistor having one end connected to the emitter of the second transistor and another end connected to the collector of the fourth transistor.

16. The power amplifier circuit according to claim 4, wherein the bias circuit further includes a resistor having one end connected to the emitter of the second transistor and another end connected to the collector of the fourth transistor.

17. The power amplifier circuit according to claim 5, wherein the bias circuit further includes a resistor having one end connected to the emitter of the second transistor and another end connected to the collector of the fourth transistor.

18. The power amplifier circuit according to claim 6, wherein the bias circuit further includes a resistor having one end connected to the emitter of the second transistor and another end connected to the collector of the fourth transistor.

19. The power amplifier circuit according to claim 7, wherein the bias circuit further includes a resistor having one end connected to the emitter of the second transistor and another end connected to the collector of the fourth transistor.

\* \* \* \* \*